(12) United States Patent
Hsu

(10) Patent No.: US 11,129,287 B2
(45) Date of Patent: Sep. 21, 2021

(54) HINGE MODULE FOR FOLDABLE TYPE DEVICE

(71) Applicant: JARLLYTEC CO., LTD., New Taipei (TW)

(72) Inventor: Yu-Tsun Hsu, New Taipei (TW)

(73) Assignee: JARLLYTEC CO., LTD., New Taipei (TW)

( * ) Notice: Subject to any disclaimer, the term of this patent is extended or adjusted under 35 U.S.C. 154(b) by 32 days.

(21) Appl. No.: 16/691,501

(22) Filed: Nov. 21, 2019

(65) Prior Publication Data

US 2020/0352044 A1 Nov. 5, 2020

(30) Foreign Application Priority Data

Apr. 30, 2019 (TW) .................................. 108115044

(51) Int. Cl.
- *H05K 5/02* (2006.01)
- *H05K 7/14* (2006.01)
- *H05K 5/03* (2006.01)

(52) U.S. Cl.
CPC ......... *H05K 5/0226* (2013.01); *H05K 5/0247* (2013.01); *H05K 5/03* (2013.01); *H05K 7/1401* (2013.01)

(58) Field of Classification Search
None
See application file for complete search history.

(56) References Cited

U.S. PATENT DOCUMENTS

| | | | | |
|---|---|---|---|---|
| 8,713,757 | B2* | 5/2014 | Chen | G06F 1/1624 |
| | | | | 16/354 |
| 10,146,266 | B2* | 12/2018 | Shibayama | G06F 1/1618 |
| 2016/0302314 | A1* | 10/2016 | Bae | G06F 1/16 |
| 2017/0357295 | A1* | 12/2017 | Tan | H04M 1/022 |
| 2020/0080357 | A1* | 3/2020 | Lin | G06F 1/1616 |
| 2020/0117233 | A1* | 4/2020 | Ou | E05D 7/00 |
| 2020/0225711 | A1* | 7/2020 | Pelissier | G06F 1/1652 |

FOREIGN PATENT DOCUMENTS

| | | |
|---|---|---|
| TW | 107113396 | 4/2018 |
| TW | 107116376 | 5/2018 |

* cited by examiner

*Primary Examiner* — James Wu
*Assistant Examiner* — Christopher L Augustin
(74) *Attorney, Agent, or Firm* — Guice Patents PLLC

(57) ABSTRACT

A hinge module for a foldable type device is connected to two casings, and applied to work with a flexible monitor. Each casing has two casing bodies. The hinge module includes a base and two slide mechanisms. End parts of two connection members of each slide mechanism are pivoted with two shaft parts of the base, thereby allowing two axial (rotating) drive members of each slide mechanism to be guided to move, opposite ends of each connection member and each radial linkage member are respectively connected to the casing body; with a transmission effect of each rotating transmission member between each axial (rotating) drive member and each radial linkage member and a mutual guiding effect between the casing bodies, each casing body can stably retract and the length variation of the flexible monitor can be compensated through the displacing path, thereby reducing the curvature of a bent portion thereof.

15 Claims, 8 Drawing Sheets

HINGE MODULE FOR FOLDABLE TYPE DEVICE

BACKGROUND OF THE INVENTION

1. Field of the Invention

The present invention relates to a hinge module, especially to a hinge module for a foldable type device.

2. Description of Related Art

Taiwan Patent Applicant No. TW107113396 (corresponding to China Patent Applicant No. CN201810371007.2, and referred as a first prior art) applied by the applicant of the present invention has disclosed a hinge module for a foldable type device, which includes a first support member, a mutual-unfolding hinge, a second support member, a multi-shaft type hinge and a third support member according to one embodiment, and can be applied to a flexible display device, so that when the whole structure is folded in an S-like status, the first support member and the second support connected to the mutual-unfolding hinge can be engaged, and an accommodation space is formed in the mutual-unfolding hinge for allowing a bent portion of the flexible display device to be accommodated; however, in the multi-shaft type hinge, there are sufficient distances which have to be saved between four shafts for allowing other components (for example a linkage member, a friction sheet, a linkage plate and a block sheet) to be disposed, thus after the whole structure is in a folded status, a gap is formed between the second support member and the third support member connected to the multi-shaft type hinge, when the flexible display device is desired to be disposed at the same sides of the three support members, the mutual-unfolding hinge and the multi-shaft type hinge, the whole thickness would be affected by the above-mentioned gap.

As such, for reducing the whole thickness, Taiwan Patent Applicant No. TW107116376 (corresponding to China Patent Applicant No. CN201810487468.6, and referred as a second prior art) applied by the applicant of the present invention has disclosed a flexible structure and an assembly having the same, which is able to improve the disadvantages of the multi-shaft type hinge disclosed in the first prior art, and capable of reducing a curvature at a bent portion of the flexible monitor while being exposed, wherein the second prior art includes a flexible structure having a plurality of first rotation units, a plurality of connection units and a plurality of second rotation units which are sequentially arranged to be adjacent to each other and mutually stacked; however, the assembly having the flexible structure disclosed in the second prior art includes two symmetrically-arranged flexible structures, a plurality of support rods and two support frames, and two opposite zones of a flexible monitor are respectively combined with the two support frames, a central portion of the flexible monitor is leaned against the plurality of support rods, so that the flexible monitor can work with the two support frames for being relatively rotated, so as to enable the flexible monitor to be in a flattened status or in a bent status, thereby allowing the whole thickness to be reduced while the whole structure being bent to a folded status.

Moreover, the applicant of the present invention has a desire to improve the structures disclosed in the first prior art and the second prior art, the applicant of the present invention wants to reduce the amount of assembling components required in the two prior arts without increasing the whole thickness after the whole structure is in the folded status, in other words a novel structure, unlike the technical features of the two prior arts, allowing the two support members of the first prior art and the two support frames of the second prior art to be mutually stacked and folded is developed, and the exposed curvature defined after the flexible display device and the flexible monitor after being folded is unlikely to be enlarged; accordingly, the present invention is provided.

SUMMARY OF THE INVENTION

One primary objective of the present invention is to provide a hinge module, in which an arc-shaped guiding slot at a shaft part of a base is served to guide a linkage convex part of an axial drive part/a rotating drive member, and a radial linkage member and a rotating transmission member are synchronously driven, and an edge guiding structure and a lateral guiding structure are respectively formed between two casing bodies; accordingly, with the connecting relations and the structural characteristics of the above-mentioned components, a compensating mechanism for folded length differentiation can be established and the required components can be simplified so as to lower the production cost, and the transmission stability can be maintained while the while structure being bent or flattened; when the whole structure is bent, a small curvature is formed at an unfolded portion of the flexible monitor, and a stably supporting effect can also be provided to a central portion of the flexible monitor while being in a flattened status.

For achieving said objective, one technical solution provided by the present invention is to provide a hinge module for a foldable type device, respectively connected to a casing, a flexible monitor is disposed at the same side of the hinge module and each of the casings for allowing the flexible monitor to be relatively rotated for being in a folded status or an unfolded status with the two casings, wherein one of the casings has a first casing body and a second casing body capable of sliding relative to the first casing body, and the hinge module includes: a base, having a first shaft part formed with a first arc-shaped guiding slot; and a first slide mechanism, including: a first connection member, have two opposite end parts thereof respectively pivoted with the first shaft part and the first casing body; a first axial drive member, having a linkage convex part and a first teeth-like structure, wherein the linkage convex part is positioned in the first arc-shaped guiding slot with a relatively guiding means, so that the first axial drive member is able to reciprocally and axially move between the first shaft part and the first casing body; a first radial linkage member, capable of being positioned in the first casing body with a relatively and radially moving means, wherein another end part of the first radial linkage member is connected to the second casing body, and a second teeth-shaped structure is formed between two end parts of the first radial linkage member; and a first rotating transmission member, capable of being pivoted with the first casing body with a rotatable means, wherein a third teeth-shaped structure and a fourth teeth-shaped structure are respectively formed between two end parts of the first rotating transmission member, the third teeth-like structure and the first teeth-like structure are engaged for interacting, the fourth teeth-like structure and the second teeth-like structure are engaged for interacting, so that an axial movement is able to be converted into a radial movement, thereby enabling the first radial linkage member to drive the second casing body to reciprocally slide relative to the first casing body; accordingly, with the two casing bodies of one of the casings performing a stretching movement, and the connection member, the axial/rotating drive member, the rotating transmission member and the radial linkage member disposed in the casing, a mutual linking effect is able to be achieved in a limited space defined in the casing, so that an effect of compensating a folded length differentiation is achieved, the casing and the slide mechanism disposed therein are able to be effectively thinned, and required components are simplified.

For achieving said objective, another technical solution provided by the present invention is to provide a hinge module for a foldable type device, respectively connected to a casing, a flexible monitor is disposed at the same side of the hinge module and each of the casings for allowing the flexible monitor to be relatively rotated for being in a folded status or an unfolded status with the two casings, wherein one of the casings has a first casing body and a second casing body capable of sliding relative to the first casing body, and the hinge module includes: a base, having a first shaft part formed with a plurality of first arc-shaped guiding slots arranged with intervals; and a first slide mechanism, including: a first connection member, have two opposite end parts thereof respectively pivoted with the first shaft part and the first casing body; a first rotating drive member, capable of being pivoted with the first casing body with a rotatable means, wherein a teeth-like structure and a first teeth-like structure are respectively formed between two ends of the first rotating drive member, the teeth-like structures has a plurality of teeth which are able to move along the corresponding first arc-shaped guiding slot with a relatively guiding mean, and at least one of the teeth is allowed to enter or retract from the corresponding at least one first arc-shaped guiding slot along the subsequent rotating movements; a first radial linkage member, capable of being positioned in the first casing body with a relatively and radially moving means, wherein another end part of the first radial linkage member is connected to the second casing body, and a second teeth-shaped structure is formed between two end parts of the first radial linkage member; and a first rotating transmission member, capable of being pivoted with the first casing body with a rotatable means, wherein a third teeth-shaped structure and a fourth teeth-shaped structure are respectively formed between two end parts of the first rotating transmission member, the third teeth-like structure and the first teeth-like structure are engaged for interacting, the fourth teeth-like structure and the second teeth-like structure are engaged for interacting, so that a rotating movement is able to be converted into a radial movement, thereby enabling the first radial linkage member to drive the second casing body to reciprocally slide relative to the first casing body; accordingly, the same effect of compensating a folded length differentiation is achieved, the casing and the slide mechanism disposed therein are able to be effectively thinned, and required components are simplified.

According to one embodiment of the present invention, the another casing has a third casing body and a fourth casing body capable of sliding relative to the third casing body, and the third casing body and the fourth casing body are formed as corresponding structures relative to the first casing body and the second casing body, and symmetrically arranged at two ends of the hinge module; the base further has a second shaft part, the second shaft part is parallel to the first shaft part and has a second arc-shaped guiding slot or a plurality of the second arc-shaped guiding slots arranged with intervals; the hinge module further includes a second slide mechanism, formed as a corresponding structure relative to the first slide mechanism, and symmetrically disposed at two opposite ends of the base; accordingly, with the two casing bodies disposed in each of the casings and capable of being mutually engaged performing a retractable movement and working with the slide mechanisms respectively disposed in the two casings, the two slide mechanisms are able to work with the retracting movement of the corresponding casings for achieving an effect of compensating a folded length differentiation, a whole structure is able to be effectively thinned and required components are able to be simplified.

According to one embodiment of the present invention, a lateral guiding rod is extended from a direction defined from the first casing body towards the second casing body, and at least one recess and at least one position limiting column are respectively formed corresponding to the second casing body, thereby allowing the at least one lateral guiding rod to pass the at least one recess then pass a slit formed between the at least one position limiting column and an inner wall of the casing; corresponding surfaces of the first radial linkage member and the lateral guiding rod are disposed with a position limiting slot and a block piece, the block piece is positioned in the position limiting slot with a moveable means; moreover, at least one lateral guiding slot is extended from a direction defined from the third casing body towards the fourth casing body, and at least one recess and at least one position limiting column are formed corresponding to the fourth casing body, thereby allowing the at least one lateral guiding rod to pass the at least one recess then pass a slit formed between the at least one position limiting column and an inner wall of the casing; opposite surfaces of the second radial linkage member and the lateral guiding rod are disposed with a position limiting slot and a block piece, the block piece is positioned in the position limiting slot with a moveable means; accordingly, with a lateral guiding structure formed between the two casing bodies of one or both of the casings, a stable displacing operation can be provided when the folded length differentiation is compensated, and the lateral guiding structure is able to define a length range for compensating the path.

According to one embodiment of the present invention, an edge of the first casing body and an edge of the second casing body are respectively formed with a first stepped part and a second stepped part which are capable of being correspondingly engaged; the first stepped part is formed with a plurality of elongated ribs which are arranged in parallel, and the second stepped part is formed with a plurality of elongated convex strips which are arranged in parallel, the plurality of elongated ribs and the plurality of elongated convex strips are connected in an interleaved means and capable of mutually guiding each other; an edge of the third casing body and an edge of the fourth casing body are respectively formed with a third stepped part and a fourth stepped part which are capable of being correspondingly engaged; the third stepped part is formed with a plurality of elongated ribs which are arranged in parallel, and the fourth stepped part is formed with a plurality of elongated convex strips which are arranged in parallel, the plurality of elongated ribs and the plurality of elongated convex strips are connected in an interleaved means and capable of mutually guiding each other; accordingly, with an edge guiding structure formed between the connecting edges of the two casing bodies of one or both of the casings, a stable displacing operation can be provided when the folded length differentiation is compensated.

According to one embodiment of the present invention, a positioning torsion unit is further disposed in the base; the positioning torsion unit has a first connection shaft, two connection supporters arranged in parallel, at least one axial elastic unit and one elastic buckling sheet; the first connection shaft and the first connection member are synchronously operated and allowed to sequentially pass one end part of the connection supporter, the at least one axial elastic unit, an end part of the another connection supporter and the elastic buckling sheet, the first connection shaft is combined with a first cam, contacting surfaces of the end part of the connection supporter and the first cam are respectively formed with a positioning recess and a protrusion capable of being mutually abutted against and connected to each other; moreover, the positioning torsion unit has a second connection shaft, at least one axial elastic unit and one elastic buckling sheet; the second connection shaft and the second connection member are synchronously operated and allowed to sequentially pass another end part of the connection supporter, the at least one axial elastic unit, another end part of the another connection supporter and the elastic buckling sheet, the second connection shaft is combined with a second cam, contacting surfaces of the another end part of the connection supporter and the second cam are respectively formed with a positioning recess and a protrusion capable of being mutually abutted against and connected to each other; accordingly, the whole structure can be supported for being maintained in position while being in a flattened status or in a folded status.

According to one embodiment of the present invention, an extending base and at least one hinge received in the extending base are further disposed between the two casings; one axial side of the extending base is formed with a first position limiting slot, an axial wall surface defined at the end part of the first connection member is correspondingly formed with a first protrusion; a first shaft disposed in the at least one hinge is pivoted with the end part of the first connection member, so that the first shaft is coaxially arranged with the first shaft part of the base, and the first protrusion is able to be positioned in the first position limiting slot with a moveable means; the extending base is further formed with at least one axial extending part for partially shielding the end part of each of the connection members and shielding a slit formed between the end parts; one axial side of the extending base is further formed with a second position limiting slot, an axial wall surface defined at the end part of the second connection member is correspondingly formed with a second protrusion, a second shaft disposed in the at least one hinge is pivoted with the end part of the second connection member, so that the second shaft is coaxially arranged with the second shaft part of the base, and the second protrusion is able to be positioned in the second position limiting slot with a moveable means; accordingly, through limiting a relative rotating range of one of two of the casings, effects of supporting and prettifying can be provided.

According to one embodiment of the present invention, an opposite axial side of the end part of the first connection member is axially extended with a first shield cover, the first shield cover is served to cover the first shaft part and formed with a radial opening for allowing the first arc-shaped guiding slot to be exposed; an opposite axial side of the end part of the second connection member is axially extended with a second shield cover, the second shield cover is served to cover the second shaft part and formed with a radial opening for allowing the second arc-shaped guiding slot to be exposed; accordingly, one or both of the shaft parts of the base can be protected, and a prettifying effect is also provided.

According to one embodiment of the present invention, the first casing body is further formed with at least one accommodating concave slot, a radial elastic unit is received in the end part of the first radial linkage member, one end part thereof is exposed out from the end part of the first radial linkage member and is in contact with a wall surface of the at least one accommodating concave slot; moreover, the third casing body is further formed with at least one accommodating concave slot, a radial elastic unit is received in the end part of the second radial linkage member, one end part thereof is exposed out from the end part of the second radial linkage member and is in contact with a wall surface of the at least one accommodating concave slot; accordingly, an loosening situation caused by slits between the components can be improved, and an imprecise sliding and positioning problem can be solved, thereby allowing each of the components of the first and/or the second slide mechanisms to be precisely moved and positioned so as to facilitate the effect of compensating the folded length differentiation.

According to one embodiment of the present invention, an adhering layer is provided between the flexible monitor and the same sides of the first casing body and the third casing body, and the same sides of the base and the extending base, the adhering layer has a first adhering zone, a second adhering zone and a third adhering zone; the first adhering zone is provided at a partial portion of the cover plate of the second casing body, the second adhering zone is provided at a partial portion of the cover plate of the fourth casing body, and the third adhering zone is served to an assistance for being selectively disposed between a central portion of the base and the extending base; accordingly, the flexible monitor can be smoothly adjacent to each of the moveable casing bodies without being separated.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

Figure 1:
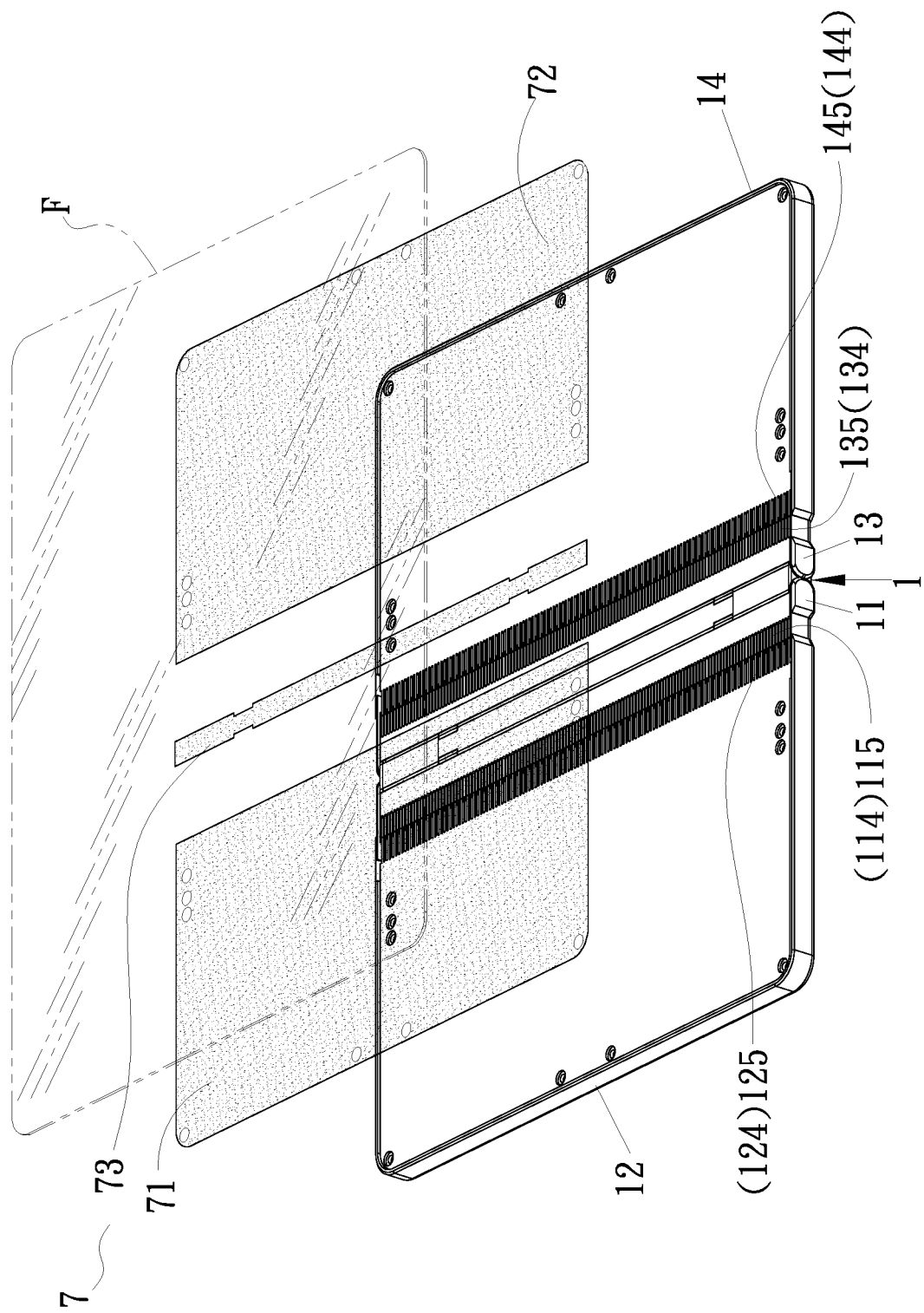
FIG. 1 is a perspective view illustrating the hinge module according to the first embodiment of the present invention, wherein the hinge module, the two casings and the extending base being assembled, and the flexible monitor and the adhering layer being removed.
Figure 2:
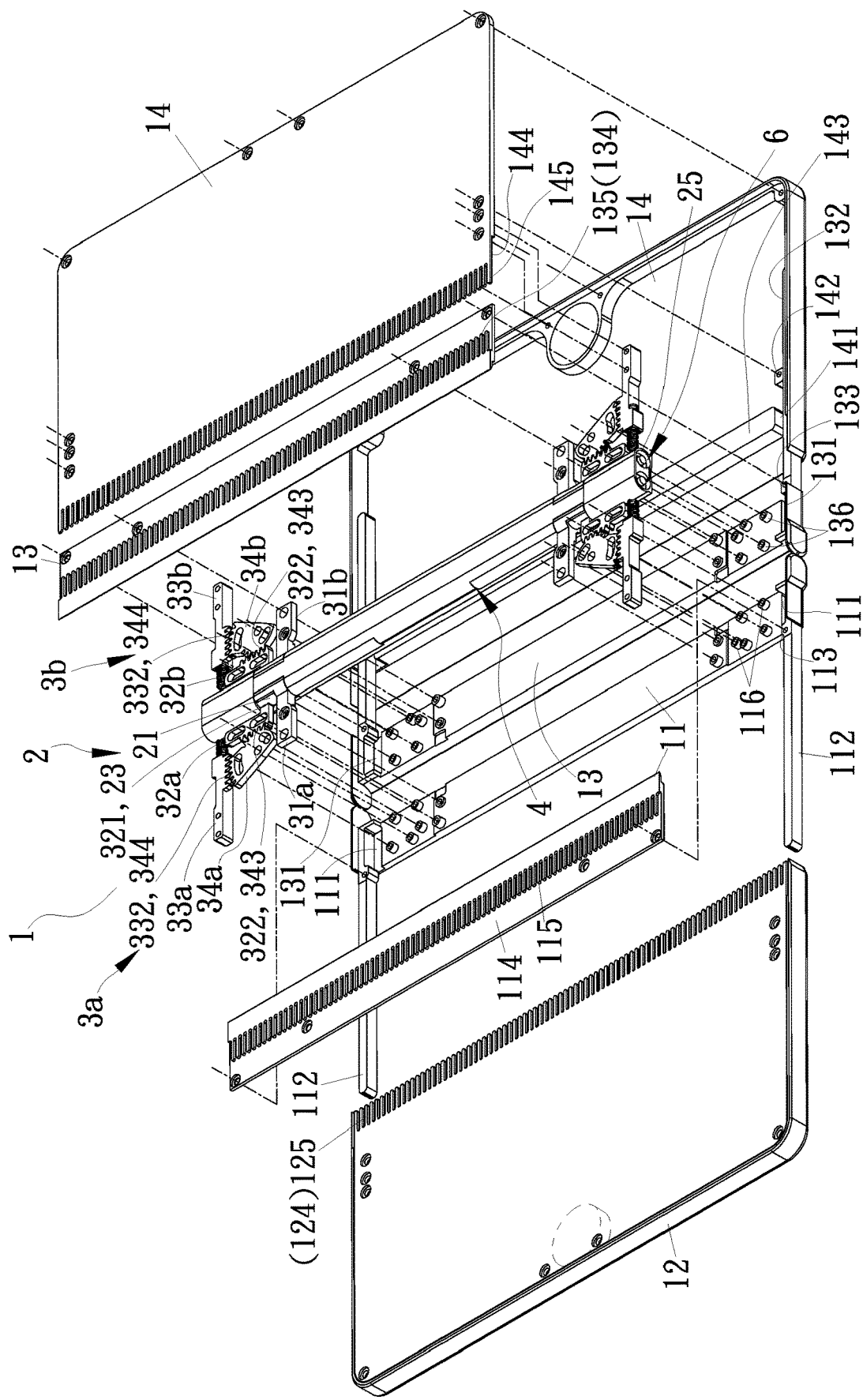
FIG. 2 is an exploded view illustrating the hinge module of FIG. 1 and the extending base being detached from the two casings.
Figure 3:
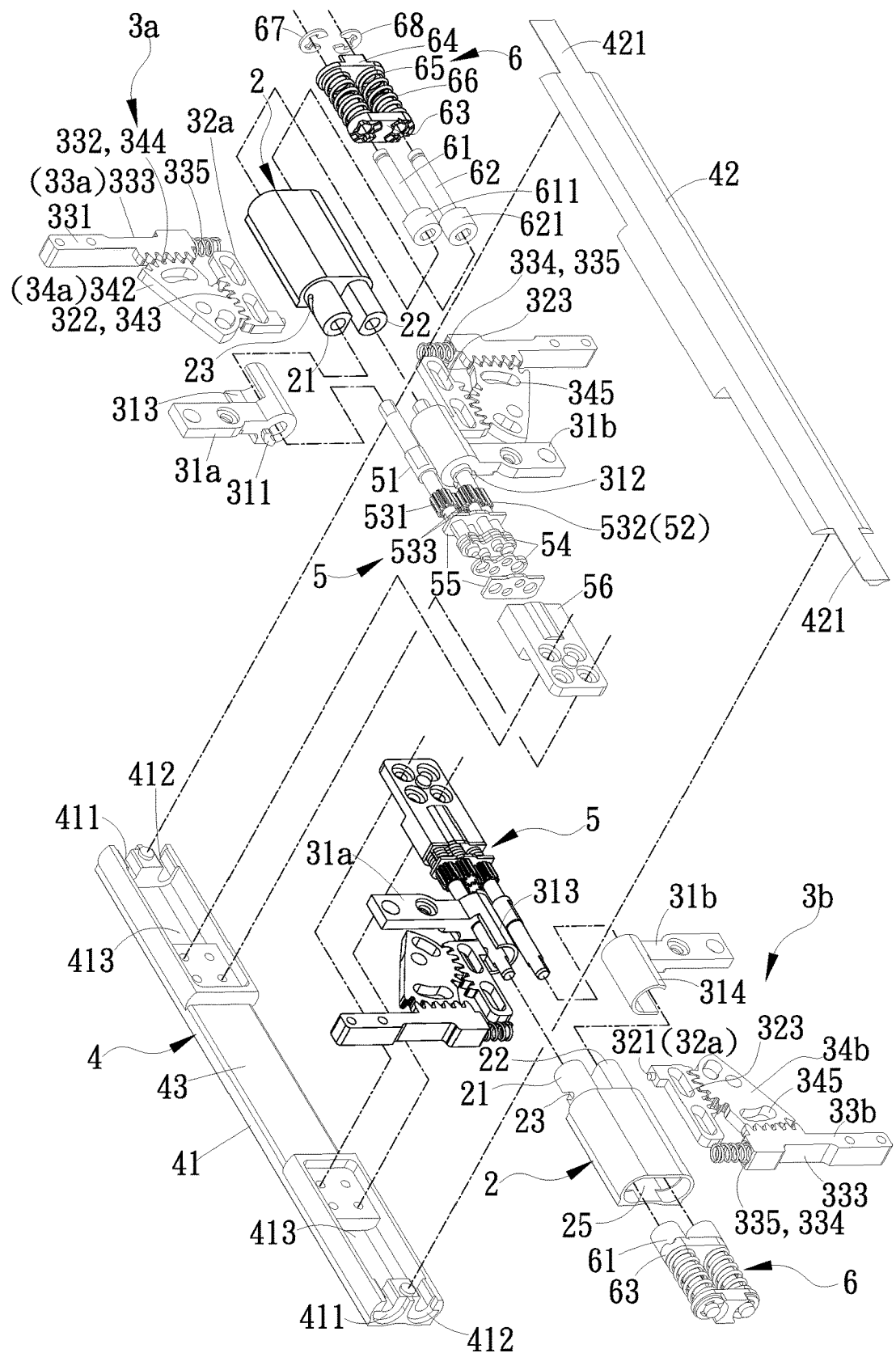
FIG. 3 is an exploded view illustrating the hinge module of FIG. 2 and the extending base.
Figure 4:
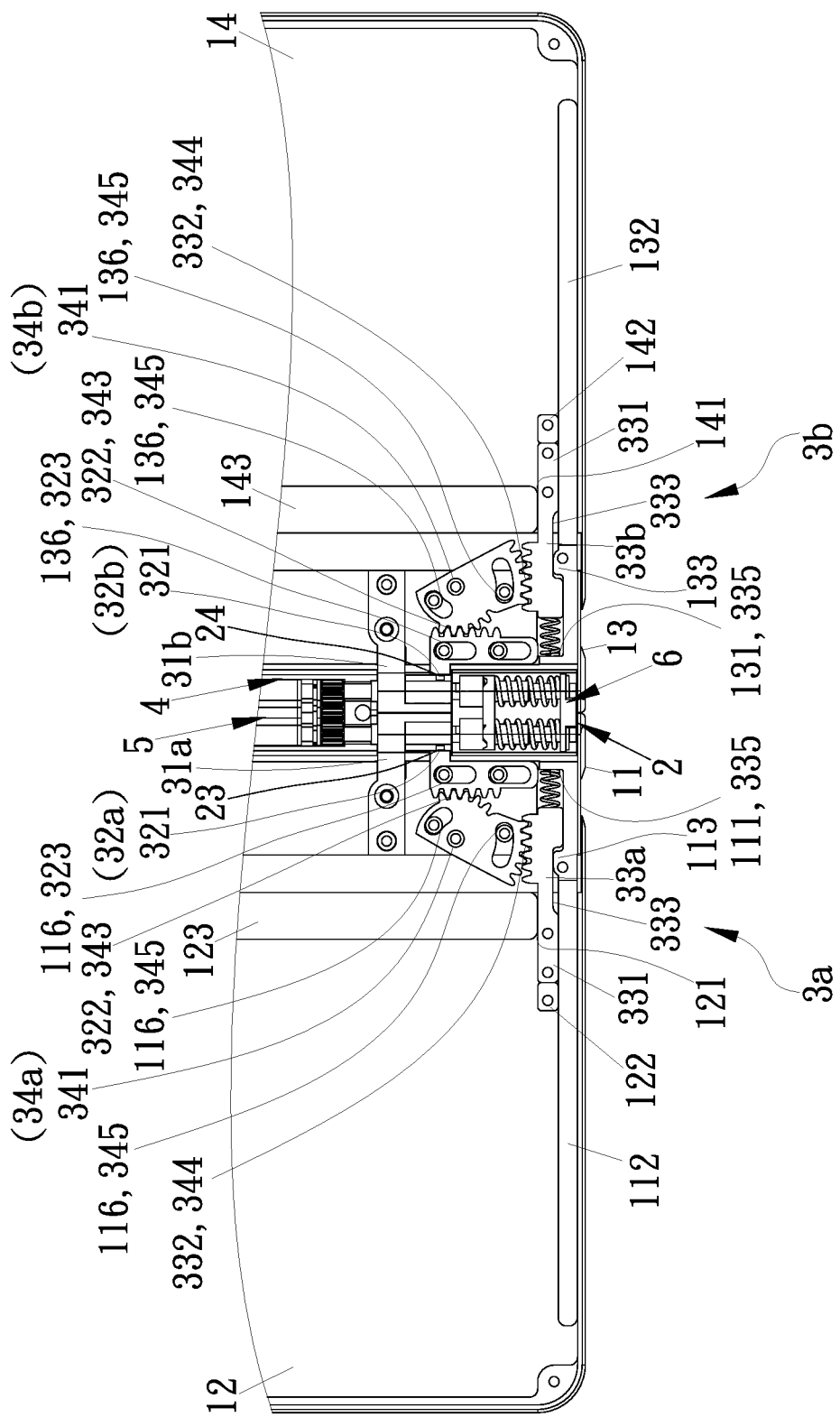
FIG. 4 is a partial cross sectional view illustrating the present invention being in a flattened status, wherein each of the casings and the cover plate of the extending base being removed and the base being shown in dashed lines, according to one preferred embodiment of the present invention.
Figure 5:
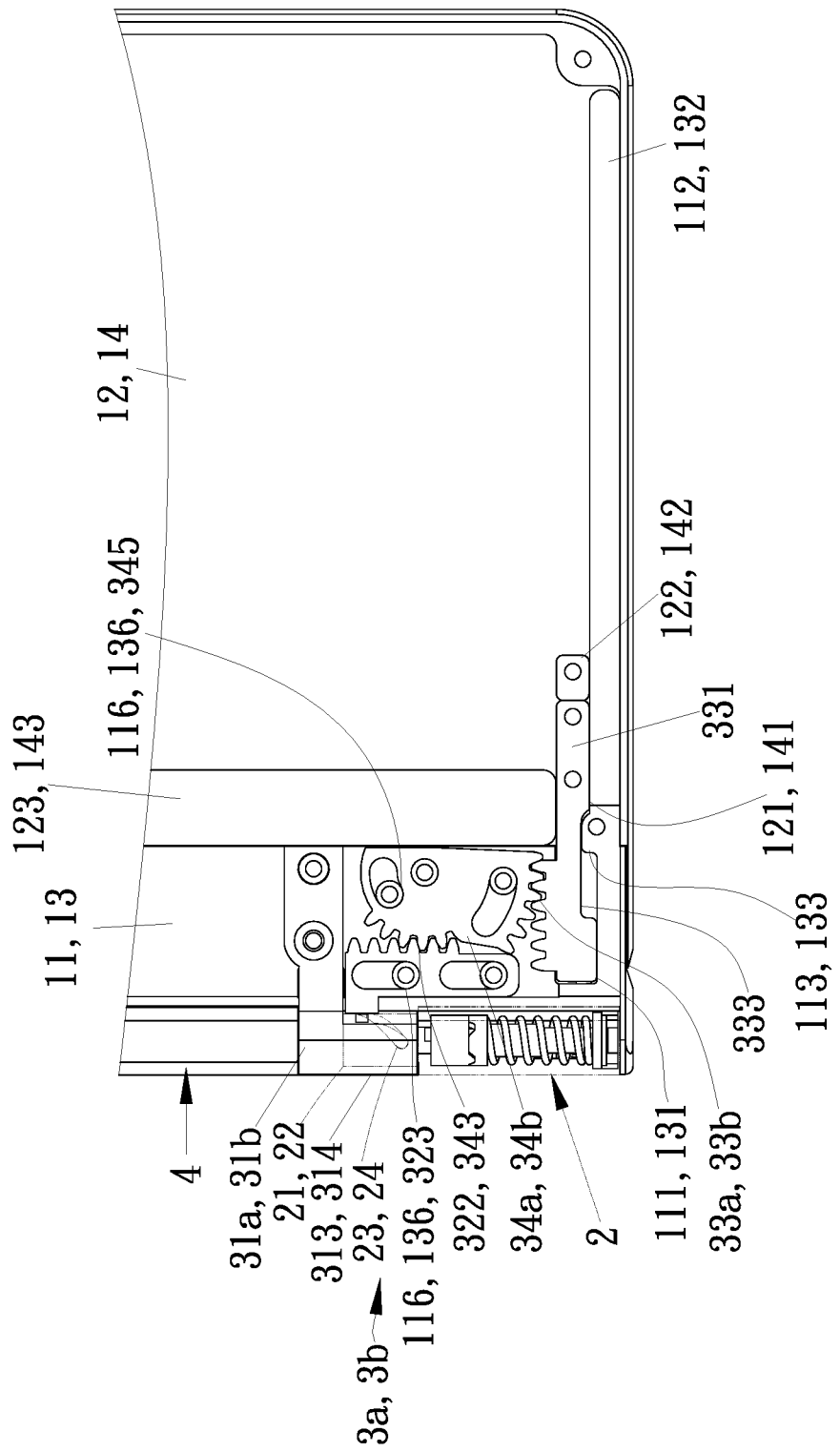
FIG. 5 is a partial top view illustrating the present invention being in a folded status, wherein the cover plate of the casing body being removed and the base being shown in dashed lines, according to one preferred embodiment of the present invention.
Figure 6:
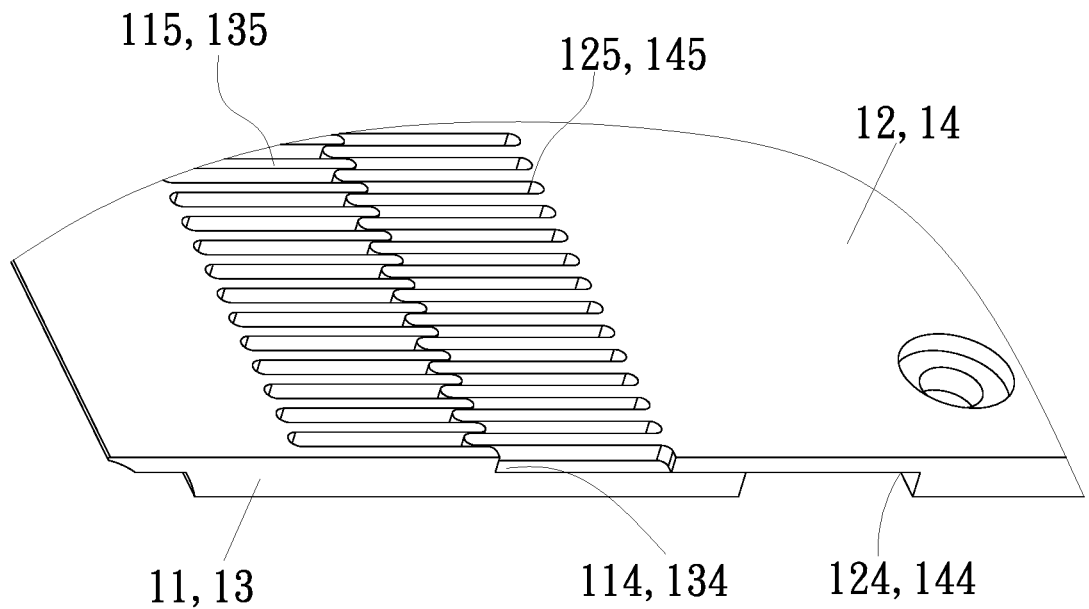
FIG. 6 is a partial enlarged view illustrating the edge guiding structure of one of the casings while being in the flattened status according to the present invention.
Figure 7:
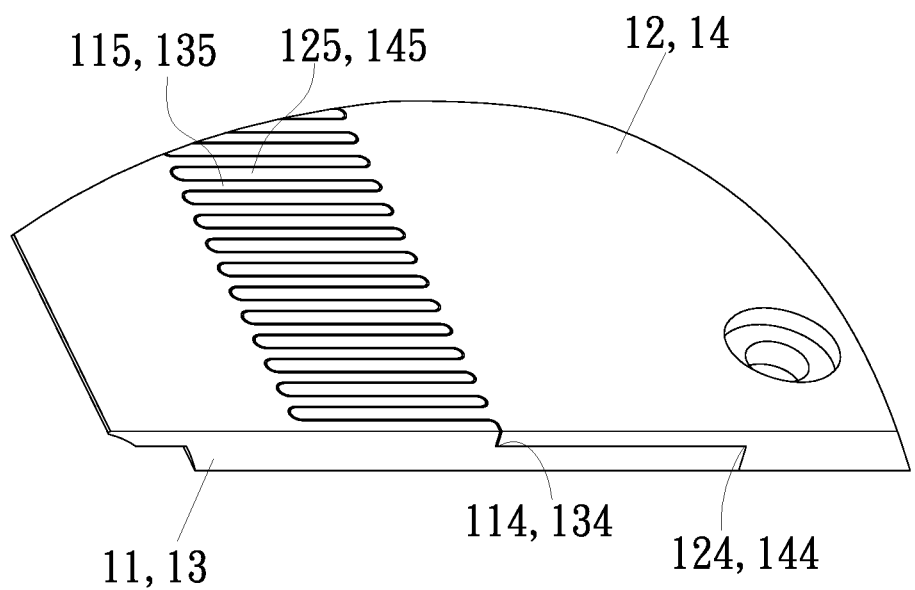
FIG. 7 is a partial enlarged view illustrating the edge guiding structure of FIG. 6 while being in the folded status according to the present invention.
Figure 8:
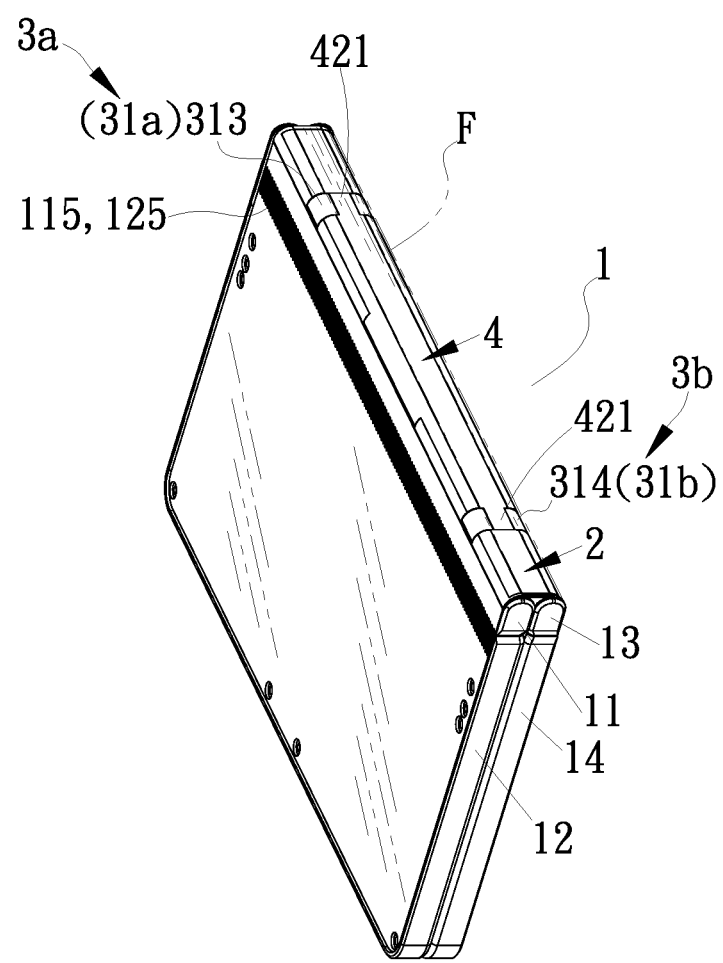
FIG. 8 is a perspective view illustrating the assembly of FIG. 1 being in the folded status according to the present invention.

Please refer from FIG. 1 to FIG. 8; a hinge module 1 is disclosed in the first embodiment of the present invention. Two opposite ends of the hinge module 1 are respectively connected to a casing, a flexible monitor F is disposed a same side of the hinge module 1 and each of the casings, so that the flexible monitor F can be relatively rotated for being in a folded status or in an unfolded status with the two casings. The hinge module 1 includes a base 2, a first slide mechanism 3a and a second slide mechanism 3b. The first slide mechanism 3a is connected to one of the casings, and the second slide mechanism 3b is connected to the another casing. The first slide mechanism 3a and the second slide mechanism 3b are formed as corresponding structures, and symmetrically arranged at two opposite ends of the base 2. An extending base 4 and at least one hinge 5 are further disposed between the two casings. The at least one hinge 5 is disposed in at least one installation part 413 inside a base member 41 of the extending base 4. A positioning torsion unit 6 is further disposed in the base 2; as such, one end part (the end part where a first connection member 31a being disposed) of the first slide mechanism 3a and one end part (the end part where a second connection member 31b being disposed) of the second slide mechanism 3b are able to be pivoted with a first shaft 51 and a second shaft 52 of the at least one hinge 5, respectively; the first shaft 51 is received in a first shaft part 21 at an axial side of the base 2 and coaxially arranged with the first shaft part 21, the second shaft 52 is received in a second shaft part 22 at an axial side of the base 2 and coaxially arranged with the second shaft part 22, thereby being able to be pivoted with a first connection shaft 61 and a second connection shaft 62 of the positioning torsion unit 6 respectively and to be served as two main rotating central line of the hinge module 1.

According to the first embodiment, in the two casings, one of the casings has a first casing body 11 and a second casing body 12 capable of sliding relative to the first casing body 11, the another casing has a third casing body 13 and a fourth casing body 14 capable of sliding relative to the third casing body 13, and the third casing body 13 and the fourth casing body 14 are formed as corresponding structures relative to the first casing body 11 and the second casing body 12, and symmetrically arranged at two ends of the hinge module 1. With the two casings being mutually engaged via the two casing bodies, a retractable movement can be generated for compensating a length differentiation formed while the flexible monitor F being in a bending process; because each of the radial connection members are respectively connected to the two casing bodies of the two casings, each of the radial connection members can be deemed as a component affecting a compensating effect; for ensuring a precise sliding and positioning effect during an operation process and stabilizing an action of compensating movement, a lateral guiding rods 112, 132 is respectively extended from a direction defined from the first casing body 11 towards the second casing body 12 and in a direction defined from the third casing body 13 towards the fourth casing body 14, and at least one recess 121, 141 and at least one position limiting column 122, 142 are respectively formed corresponding to the second casing body 12 and the fourth casing body 14, thereby allowing each of the at least one lateral guiding rods 112, 132 to respectively pass each of the at least one recesses 121, 141, then pass a slit respectively formed each of the position limiting columns 122, 142 and an inner wall of each of the casing bodies, so that each of the lateral guiding rods 112, 132 can be clamped and positioned, and a lateral guiding structure can be respectively formed in the two casings for providing a stabilizing effect while the length differentiation being compensated, opposite surfaces of each first linkage member 33a, 33b and each of the lateral guiding rods 112, 132 are disposed with a position limiting slot 333 and a block piece 113, 133, and each of the block pieces 113, 133 can be respectively positioned in each of the position limiting slots 333 with a moveable means, thereby defining a length range for compensating the length differentiation.

Moreover, an edge of the first casing body 11 and an edge of the second casing body 12 are respectively formed with a first stepped part 114 and a second stepped part 124 which are capable of being correspondingly engaged; an edge of the third casing body 13 and an edge of the fourth casing body 14 are respectively formed with a third stepped part 134 and a fourth stepped part 144 which are capable of being correspondingly engaged; the first stepped part 114 and the third stepped part 134 are both formed with a plurality of elongated ribs 115, 135 which are arranged in parallel, and the second stepped part 124 and the fourth stepped part 144 are both formed with a plurality of elongated convex strips 125, 145 which are arranged in parallel, the plurality of elongated ribs 115, 135 and the plurality of elongated convex strips 125, 145 are connected in an interleaved means and capable of mutually guiding each other, so that connecting edges of the two casing bodies of each of the casings can be respectively formed as an edge guiding structure for increasing the operation stability in the process of compensating the length differentiation.

Moreover, the first shaft part 21 and the second shaft part 22 are arranged in parallel at one axial side of the base 2, the first shaft part 21 is formed with a first arc-shaped guiding slot 23, the second shaft part 21 is formed with a second arc-shaped guiding slot 24, opposite axial sides of the base 2 are concavely formed with an accommodation part 25 for accommodating the whole positioning torsion unit 6; the positioning torsion unit 6 has the first connection shaft 61 and the second connection shaft 62, and further has two connection supporters 63, 64, at least two axial elastic units 65, 66 and two elastic buckling sheets 67, 68. The first connection shaft 61 and the second connection shaft 62 are arranged in parallel and allowed to respectively pass shaft holes at two end parts of one of the connection supporters 63, then sleeved with the at least one axial elastic unit 65, 66 then pass shaft holes at two end parts of the another connection supporters 64, and respectively buckled with the elastic buckling sheets 67, 68, wherein, the first connection shaft 61 is combined with a first cam 611, the second connection shaft 62 is combined with a second cam 621, contacting surfaces of the connection supporter 63 and the first cam 611 and the second cam 621 are respectively formed with a positioning recess and a protrusion capable of being mutually abutted against and connected to each other.

The extending base 4 has the above-mentioned base member 41 and a cover plate 42 covering the base member 41, thereby facilitating the manufacturing and assembling process; a passageway 43 is formed between the base member 41 and the cover plate 42 for allowing an electric wiring to pass so as to be electrically connected to a circuit module in the two casings; one axial side of the base member 41 of the extending base 4 is respectively formed with a first position limiting slot 411 and a second position limiting slot 412, an axial wall surface defined at the end part of the first connection member 31a is correspondingly formed with a first protrusion 311, so that the first protrusion 311 is able to be positioned in the first position limiting slot 411 with a moveable means, and a rotating range of the first connection member 31a is restrained between two opposite slot surfaces of the first position limiting slot 411; an axial wall surface defined at the end part of the second connection member 31b is correspondingly formed with a second protrusion 312, so that the second protrusion 312 is able to be positioned in the second position limiting slot 412 with a moveable means, and a rotating range of the second connection member 31b is restrained between two opposite slot surfaces of the second position limiting slot 412; on the other hand, an opposite axial side of the end part of the first connection member 31a is axially extended with a first shield cover 313, the first shield cover 313 is served to cover the first shaft part 21 and formed with a radial opening for allowing the first arc-shaped guiding slot 23 to be exposed, an opposite axial side of the end part of the second connection member 31b is axially extended with a second shield cover 314, the second shield cover 314 is served to cover the second shaft part 22 and formed with a radial opening for allowing the second arc-shaped guiding slot 24 to be exposed; the cover plate 42 of the extending base 4 is further formed with an axial extending part 421 for partially shielding the end part of the first connection member 31a, the end part of the second connection member 31b and shielding a slit formed between the two end parts; the base 2 and extending base 4, the end part of the first connection member 31a and the end part of the second connection member 31b are arranged at a same side for forming a complete contour, so that the flexible monitor F located at the location can be supported and a portion thereof can be adjacently arranged, thereby prettying the whole appearance.

The at least one hinge 5 further has the first shaft 51, the second shaft 52, a first gear 531, a second gear 532, at least one middle gear 533, a plurality of torsion units 54 and a plurality of connecting units 55, 56; the first gear 531 is coaxially combined with the first shaft 51, the second gear 532 is coaxially combined with the second shaft 52, the at least one middle gear 533 is arranged between the first gear 531 and the second gear 532, thereby forming a gear engaging and a synchronously operating status; a rotation axis line of the first shaft 51, a rotation axis line of the second shaft 52 and a rotation axis line of the at least one middle gear 533 are arranged in a parallel status, and the first shaft 51, the second shaft 52 and the at least one middle gear 533 respectively sleeve with the plurality of torsion units 54 and the plurality of connecting units 55, 56, so that a stable assembling status is established, and effects of synchronously rotating and generating torsions are provided; the at least one hinge 5 is fastened in the at least one installation slot 413 through the connecting unit 56, the first shaft 51 and the second shaft 52 are allowed to respectively pass the first position limiting slot 41 and the second position limiting slot 412, so as to be respectively pivoted in the shaft hole at the end part of the first connection member 31a and the shat hole at the end part of the second connection member 31b; what shall be addressed is that the first shaft 51 and the second shaft 52 can also be respectively combined with the end part of the first connection member 31a and the end part of the second connection member 31b so as to be formed as an integral structure, then coaxially arranged with the first shaft part 21 and the second shaft part 23 of the base 2, respectively.

The first slide mechanism 3a has the first connection member 31a, and further has a first axial drive member 32a, a first radial linkage member 33a and a first rotating transmission member 34a; wherein, one end part of the first connection member 31a allows the first shaft 51 to pass so as to be pivoted with the first shaft part 21, an opposite end part of the first connection member 31a is connected and fastened with a lateral inner wall of the first casing body 11; a radial side of the first axial drive member 32a is protruded with a linkage convex part 321 for being guided into the first arc-shaped guiding slot 23, and a first teeth-like structure 322 having a plurality teeth is linearly arranged at an opposite radial side of the first axial drive member 32a; the first rotating transmission member 34a has a plate member 342 and a support column 341 served as a rotation center of the plate member 342, the support column 341 is combined with the plate member 342 or combined with the first casing body 11, and the first rotating transmission member 34a is pivoted and positioned on the lateral inner wall of the first casing body 11 via the support column 341, two different radiuses are respectively defined between the rotation center to two end parts of the plate member 342, so that a circumference at one end part of the plate member 342 of the first rotating transmission member 34a is formed with a plurality of teeth arranged along a circumferential direction thereby forming a third teeth-shaped structure 343, and a circumference at another end part of the plate member 342 of the first rotating transmission member 34a is formed with a plurality of teeth arranged along a circumferential direction thereby forming a fourth teeth-shaped structure 344; one end part of the first radial linkage member 33a is positioned in the first casing body 11 with a relatively moveable means, a radial elastic unit 335 is disposed at the end part of the first radial linkage member 33a, one end thereof is exposed from the end part of the first radial linkage member 33a and is in contact with a wall surface of at least one accommodating concave slot 111 formed in the first casing body 11, so that an anti-loosening effect can be provided, and a poor affection caused by the slit can be improved, another end part of the first radial linkage member 33a is formed as a connection part 331 which protrudes into the second casing body 12 and is connected to the plate member, and a plurality of teeth are linearly arranged at an axial side defined between two end parts of the first radial drive member 32a, thereby forming a second teeth-like structure 332.

The second slide mechanism 3b has the second connection member 31b, and further has a second axial drive member 32b, a second radial linkage member 33b and a second rotating transmission member 34b; wherein, one end part of the second connection member 31b allows the second shaft 52 to pass so as to be pivoted with the second shaft part 22, an opposite end part of the second connection member 31b is connected and fastened with a lateral inner wall of the third casing body 13, and the second connection member 31b and the first connection member 31a are formed as corresponding structures; a radial side of the second axial drive member 32b is protruded with a linkage convex part 321 for being guided into the second arc-shaped guiding slot 24, and the first teeth-like structure 322 having a plurality teeth is linearly arranged at an opposite radial side of the second axial drive member 32b, so that the second axial drive member 32b and the first axial drive member 32a are formed as corresponding structures; the second rotating transmission member 34b and the first rotating transmission member 34a are also formed as corresponding structures, thus the second rotating transmission member 34b also has the plate member 342 and the support column 341 served as a rotation center of the plate member 342, the support column 341 is combined with the plate member 342 or combined with the third casing body 13, the second rotating transmission member 34b is also pivoted via the support column 341 so as to be positioned on a lateral inner wall of the third casing body 13, two different radiuses are respectively defined between the rotation center to two end parts of the plate member 342, so that a circumference at one end part of the plate member 342 of the second rotating transmission member 34b is formed with a plurality of teeth arranged along a circumferential direction thereby forming the third teeth-shaped structure 343, and a circumference at another end part of the plate member 342 of the second rotating transmission member 34b is formed with a plurality of teeth arranged along a circumferential direction thereby forming the fourth teeth-shaped structure 344; the second radial linkage member 33b and the first radial linkage member 33a are formed as corresponding structures, one end part of the second radial linkage member 33b is positioned in the third casing body 13 with a relatively moveable means, the radial elastic unit 335 is disposed at the end part of the second radial linkage member 33b, one end thereof is exposed from the end part of the second radial linkage member 33b and is in contact with a wall surface of at least one accommodating concave slot 131 formed in the third casing body 13, so that an anti-loosening effect can be provided, and a poor affection caused by the slit can be improved, another end part of the second radial linkage member 33b is formed as a connection part 331 which protrudes into the fourth casing body 14 and is connected to the plate member, and a plurality of teeth are linearly arranged at an axial side defined between two end parts of the second radial drive member 32b, thereby forming a second teeth-like structure 332; accordingly, the third teeth-like structure 343 and the fourth teeth-like structure 344 at the two end parts of the second rotating transmission member 34b can be respectively engaged and interacted with the first teeth-like structure 322 and the second teeth-like structure 332, and an axial movement can be converted into a radial movement, meanwhile the second radial linkage member 33b is able to drive the fourth casing body 14 to reciprocally slide relative to the third casing body 13.

For restraining a sliding displacement range and allowing a stable operation to be performed in a limited space defined in the thinned casing, besides the above-mentioned slide mechanism 3a and the another slide mechanism 3b, internal columns 116, 136 are further vertically protruded from an inner wall surface of the first casing body 11 and an inner wall of the third casing body 13, wherein the two internal columns 116 of the first casing body 11 are respectively positioned in two axial elongated guiding holes 323 of the first axial drive member 32a, so that the first axial drive member 32a is able to reciprocally and axially move between the first shaft part 21 and the first casing body 11, and the linkage convex part 321 of the first axial drive member 32a is able to reciprocally move in the first arc-shaped guiding slot 23 with a relatively guiding means, the other two internal columns 116 of the first casing body 11 are respectively positioned in two arc-shaped guiding holes 345 of the first rotating transmission member 34a with a moveable means; the two internal columns 136 of the third casing body 13 are respectively positioned in two axial elongated guiding holes 323 of the second axial drive member 32b, so that the second axial drive member 32b is able to reciprocally and axially move between the second shaft part 24 and the third casing body 13, and the linkage convex part 321 of the second axial drive member 32b is able to reciprocally move in the second arc-shaped guiding slot 24 with a relatively guiding means, the other two internal columns 136 of the third casing body 13 are respectively positioned in two arc-shaped guiding holes 345 of the second rotating transmission member 34b with a moveable means; an inner wall surface of the second casing body 12 and an inner wall surface of the fourth casing body 14 are respectively protruded with a step 123, 143, each of the steps 123, 143 is arranged to be adjacent to each of the recesses 121, 141, and at least one block surface are correspondingly formed an edge of the first rotating transmission member 34a and an edge of the second rotating transmission member 34b; after the two casing bodies of each of the casings are correspondingly prolonged for enabling the whole structure to be in a flattened status or correspondingly decreased for enabling the whole structure to be in a folded status, each of the block surfaces is respectively served to form a blocking status with each of the steps 123, 143.

As such, during a process of the two casings being in a relatively unfolding status, the end parts of the two connection members are able to respectively form relative rotations with the axial side of the extending base 4, and also able to respectively and synchronously form relative rotations with the two shaft parts of the base 2, so that the linkage convex part 321 of the first axial drive member 32a and the linkage convex part 321 of the second axial drive member 32b are able to be guided to move respectively along the arc-shaped guiding slot of the first shaft part 21 and the arc-shaped guiding slot of the second shaft part 22; with the third teeth-like structure 343 of the first rotating transmission member 34a and the third teeth-like structure 343 of the second rotating transmission member 34b engaging and interacting with the first teeth-like structure 322, and the fourth teeth-like structure 344 engaging and interacting with the second teeth-like structure 332, an axial movement can be converted into a radial movement, so that the first radial linkage member 33a and the second radial linkage member 33b can respectively drive the second casing body 12 and the fourth casing body 14 to reciprocally slide relative to the first casing body 11 and the third casing body 13 till the first protrusion 311 and the second protrusion 312 being blocked on a lateral slot wall of the first position limiting slot and a lateral slot wall of the second position limiting slot, and with one of the block surfaces of the first rotating transmission member 34a and one of the block surfaces of the second rotating transmission member 34b being respectively blocked by a lateral wall of the step 123 and a lateral wall of the step 143, the protrusion of the first cam 611 and the protrusion of the second cam 621 are respectively allowed to enter each of the position limiting concave slot corresponding to the connection supporter 63, thereby forming a positioning effect, and the foldable type device can be supported for being maintained in a positioned status or in a flattened status; on the other hand, during a process of the two casings being in a relatively engaged status, the protrusion of the first cam 611 and the protrusion of the second cam 612 are respectively guided out from each of the positioning recesses corresponding to the connection supporter 63, and other component of each of the slide mechanisms are operated to reversely move till the first protrusion 311 and the second protrusion 312 being respectively blocked in the opposite lateral slot walls of the two position limiting slots; during this process, one of the block surfaces of the first rotating transmission member 34a and one of the block surfaces of the second rotating transmission member 34b are respectively blocked on the lateral wall of the step 123 and the lateral wall of the step 143, at this moment the protrusion of the first cam 611 and the protrusion of the second cam 621 are allowed to enter other positioning recesses of the connection supporter 63, thereby forming a positioning effect, and the foldable type device can be supported for being maintained in the positioned status or in the folded status.

Figure 9:
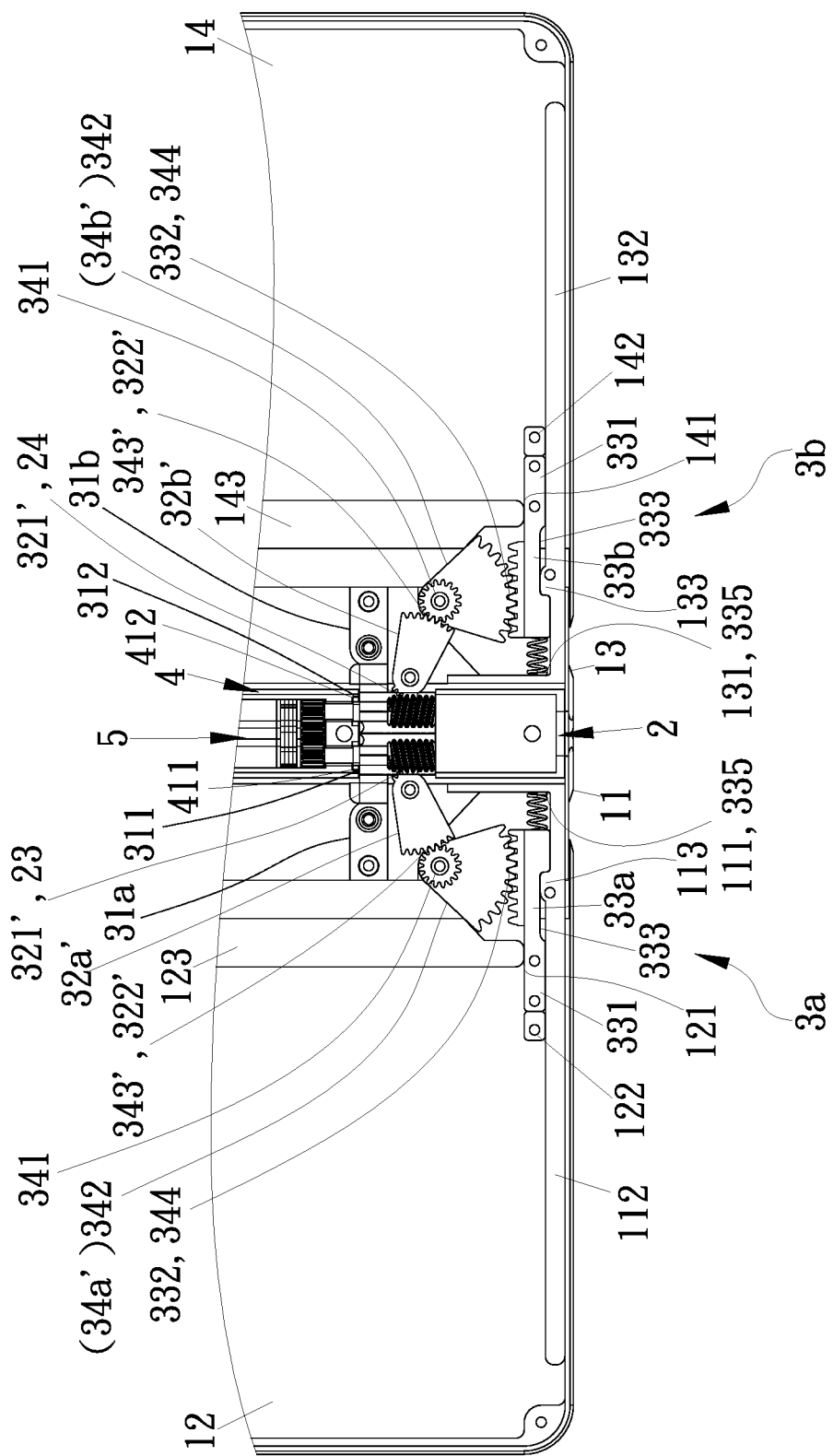
FIG. 9 is a partial top view illustrating hinge module being in the flattened status, wherein each of the casings and the cover plate of the casing body being removed and the first connection member and the second connection member being shown in dashed lines, according to the second embodiment of the present invention.

Please refer to FIG. 9, which discloses a hinge module 1' according a second embodiment of the present invention; a first rotating drive member 32a' and a second rotating drive member 32b' are adopted to replace the first axial drive member 32a and the second axial drive member 32b, and the differences between the hinge module 1 disposed in the first embodiment and the hinge module 1' disclosed in the second embodiment are as follows: the plurality of first arc-shaped guiding slots 23 and the plurality of second arc-shaped guiding slots 24 arranged with intervals are respectively disposed on the first shaft part 21 and the second shaft part 22 of the base 2, and the first rotating drive member 32a' and the second rotating drive member 32b' are respectively pivoted with the first casing body 11 and the third casing body 13 with a rotatable means, a teeth-like structure 321' and a first teeth-like structure 322' are respectively formed between two ends of the first rotating drive member 32a' and between two ends of the second rotating drive member 32b', each of the teeth-like structures 321' has a plurality of teeth which are able to move along the corresponding first arc-shaped guiding slot 23 and along the corresponding second arc-shaped guiding slot 24 with a relatively guiding means, and at least one teeth thereof is allowed to enter or retract from the at least one corresponding first arc-shaped guiding slot 23 and the at least one corresponding second arc-shaped guiding slot 24 along the subsequent rotating movements; as such, each of the third teeth-like structures 343 and each of the first teeth-like structures 322' can be engaged for interacting, and each of the fourth teeth-like structures 344 and each of the second teeth-like structures 322 can be engaged for interacting, thus a rotating movement can be converted into a radial movement, and each of the radial linkage members can drive the second casing body 12 and the fourth casing body 14 to reciprocally slide relative to the first casing body 11 and the third casing body 13, respectively.

According to the second embodiment, the second rotating drive member 32b' and the first rotating drive member 32a' are formed as corresponding structures, a second rotating transmission member 34b' and a first rotating transmission member 34a' are formed as corresponding structures, so that only the first rotating drive member 32a' and the first rotating transmission member 34a' are provided with illustrations; wherein, the first rotating drive member 32a' and the first rotating transmission member 34a' are served to allow two different radiuses to be respectively defined between the rotation center to two end parts of the plate member, so that the teeth-shaped structure 322' is formed as a plurality of teeth arranged on a circumference defined at one end part of the first rotating drive member 32a' along a circumferential direction, the first teeth-shaped structure 321' is formed as a plurality of teeth arranged on a circumference defined at another end part of the first rotating drive member 32a' along a circumferential direction, the third teeth-shaped structure 343 is formed as a plurality of teeth annularly arranged on a circumference of the support column 341 of the first rotating transmission member 34a', the fourth teeth-shaped structure 344 is formed as a plurality of teeth arranged on a circumference defined at another end part of the first rotating transmission member 34a' along a circumferential direction; the accommodating concave slot 111 of the first casing body 11 and the accommodating concave slot 131 of the third casing body 13 are formed with L-shaped outlines, so that the first teeth-like structure 322' of the first rotating drive member 32a' is allowed to pass the plate member 342 of the first rotating transmission member 34a' for being engaged with the third teeth-like structure 343 at the location of the support column 341 of the first rotating transmission member 34a' within a thin limited space; moreover, the block surfaces at two sides of the two rotating transmission members can respectively form a blocked status with each of the at least one accommodating concave slots 111, 131 and the lateral wall of each of the steps 123, 143 while being in the flattened status or in the folded status; and what shall be addressed is that other assembling structures are the same as what has been disclosed in the first embodiment, thus no further illustration is provided.

According to the two embodiments, for enabling the flexible monitor F to be smoothly adjacent to each of the moveable casing bodies without being separated, as shown in FIG. 1, an adhering layer 7 is provided between the flexible monitor F and the same sides of the first casing body 11 and the third casing body 13, and the same sides of the base 2 and the extending base 4, the adhering layer 7 has a first adhering zone 71, a second adhering zone 72 and a third adhering zone 73; the first adhering zone 71 is provided at a partial portion (the second step part 124 being excluded) of the cover plate of the second casing body 12, the second adhering zone 72 is provided at a partial portion (the fourth step part 144 being excluded) of the cover plate of the fourth casing body 14, and the third adhering zone 73 is served to an assistance for being selectively disposed between a central portion of the base 2 and the extending base 4, so that the three adhering zones can be respectively adhered to corresponding zones of the flexible monitor F.

Based on what has been disclosed above, advantages achieved by the present invention are as follows. The arc-shaped guiding slot at the shaft part of the base is served to guide the axial drive part of the slide mechanism or the linkage convex part of the rotating drive member, and the rotating transmission member and the radial linkage member are provided for forming a gear engaging and synchronously operating module, and the require components can be simplified so as to lower the production cost; with the edge guiding structure and the lateral guiding structure respectively formed between the two casing bodies of each of the casings, an effect of assisting the compensating length differentiation can be achieved, the load can also be shared, the volume can be reduced and the thickness can be thinned, so that a whole structure with the compensating folded length differentiation mechanism can be provided; when the whole structure is bent, a small curvature is formed at a central portion of the flexible monitor while being exposed, and a stably supporting effect can also be provided to the central portion of the flexible monitor while being in a flattened status.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific examples of the embodiments disclosed and that modifications and other embodiments are intended to be included within the scope of the appended claims. Although specific terms are employed herein, they are used in a generic and descriptive sense only and not for purposes of limitation.

What is claimed is:

1. A hinge module for a foldable type device, comprising two casings, a flexible monitor being disposed at a same side of said hinge module and each of said casings for allowing said flexible monitor to be relatively rotated for being in a folded status or an unfolded status with said two casings, wherein one of said casings having a first casing body and a second casing body capable of sliding relative to said first casing body, and said hinge module including:
   a base, having a first shaft part formed with a first arc-shaped guiding slot; and
   a first slide mechanism, including:
      a first connection member, having two opposite end parts thereof respectively pivoted with said first shaft part and said first casing body;
   a first axial drive member, having a linkage convex part and a first teeth-like structure, wherein said linkage convex part is positioned in said first arc-shaped guiding slot and is guided within said first arc-shaped guiding slot, so that said first axial drive member is able to reciprocally and axially move between said first shaft part and said first casing body;
      a first radial linkage member, having one end part moveably positioned in said first casing body, wherein another end part of said first radial linkage member is connected to said second casing body, and a second teeth-like structure is formed between said one end part and said another end part of said first radial linkage member; and
      a first rotating transmission member, being rotatably connected with said first casing body, wherein a third teeth-like structure and a fourth teeth-like structure are respectively formed between two end parts of said first rotating transmission member, said third teeth-like structure and said first teeth-like structure are engaged for interacting, said fourth teeth-like structure and said second teeth-like structure are engaged for interacting, so that an axial movement is able to be converted into a radial movement, thereby enabling said first radial linkage member to drive said second casing body to reciprocally slide relative to said first casing body.

2. The hinge module for the foldable type device as claimed in claim 1, wherein said another casing has a third casing body and a fourth casing body capable of sliding relative to said third casing body, and said third casing body and said fourth casing body are formed as corresponding structures relative to said first casing body and said second casing body, and symmetrically arranged at two ends of said hinge module; said base further has a second shaft part, said second shaft part is parallel to said first shaft part and has a second arc-shaped guiding slot; said hinge module further includes a second slide mechanism, corresponding with said first slide mechanism, and symmetrically disposed at two opposite ends of said base.

3. The hinge module for the foldable type device as claimed in claim 1, wherein a least one lateral guiding rod is extended from a direction defined from said first casing body towards said second casing body, and at least one recess and at least one position limiting column are respectively formed corresponding to said second casing body, thereby allowing said at least one lateral guiding rod to pass said at least one recess then pass a slit formed between said at least one position limiting column and an inner wall of one of said two casings; corresponding surfaces of said first radial linkage member and said lateral guiding rod are disposed with a position limiting slot and a block piece, and said block piece is moveably positioned in said position limiting slot.

4. The hinge module for the foldable type device as claimed in claim 2, wherein at least one lateral guiding rod is extended from a direction defined from said third casing body towards said fourth casing body, and at least one recess and at least one position limiting column are formed corresponding to said fourth casing body, thereby allowing said at least one lateral guiding rod to pass said at least one recess then pass a slit formed between said at least one position limiting column and an inner wall of one of said two casings; opposite surfaces of a second radial linkage member and said lateral guiding rod are disposed with a position limiting slot and a block piece, and said block piece is moveably positioned in said position limiting slot.

5. The hinge module for the foldable type device as claimed in claim 1, wherein an edge of said first casing body and an edge of said second casing body are respectively formed with a first stepped part and a second stepped part which are capable of being correspondingly engaged; said first stepped part is formed with a plurality of elongated ribs which are arranged in parallel, and said second stepped part is formed with a plurality of elongated convex strips which are arranged in parallel, said plurality of elongated ribs and said plurality of elongated convex strips are connected in an interleaved manner and capable of mutually guiding each other.

6. The hinge module for the foldable type device as claimed in claim 2, wherein an edge of said third casing body and an edge of said fourth casing body are respectively formed with a third stepped part and a fourth stepped part which are capable of being correspondingly engaged; said third stepped part is formed with a plurality of elongated ribs which are arranged in parallel, and said fourth stepped part is formed with a plurality of elongated convex strips which are arranged in parallel, said plurality of elongated ribs and said plurality of elongated convex strips are connected in an interleaved manner and capable of mutually guiding each other.

7. The hinge module for the foldable type device as claimed in claim 1, wherein a positioning torsion unit is further disposed in said base; said positioning torsion unit has a first connection shaft, two connection supporters arranged in parallel, at least one axial elastic unit and one elastic buckling sheet; said first connection shaft and said first connection member are synchronously operated and allowed to sequentially pass one end part of a first connection supporter of said two connection supporters, said at least one axial elastic unit, an end part of a second connection supporter of said two connection supporters and said elastic buckling sheet, said first connection shaft is combined with a first cam, contacting surfaces of said one end part of said first connection supporter and said first cam are respectively formed with a positioning recess and a protrusion capable of being mutually abutted against and connected to each other.

8. The hinge module for the foldable type device as claimed in claim 2, wherein a positioning torsion unit is further disposed in said base; said positioning torsion unit has a connection shaft, two connection supporters arranged in parallel, at least one axial elastic unit and one elastic buckling sheet; said connection shaft and a second connection member are synchronously operated and allowed to sequentially pass an end part of a first connection supporter of said two connection supporters, said at least one axial elastic unit, an end part of a second connection supporter of said two connection supporters and said elastic buckling sheet, said connection shaft is combined with a cam, contacting surfaces of said another end part of said first connection supporter and said cam are respectively formed with a positioning recess and a protrusion capable of being mutually abutted against and connected to each other.

9. The hinge module for the foldable type device as claimed in claim 1, wherein an extending base and at least one hinge received in said extending base are further disposed between said two casings; one axial side of said extending base is formed with a first position limiting slot, an axial wall surface defined at said end part of said first connection member is correspondingly formed with a first protrusion; a first shaft disposed in said at least one hinge is pivoted with said end part of said first connection member, so that said first shaft is coaxially arranged with said first shaft part of said base, and said first protrusion is moveably positioned in said first position limiting slot; said extending base is further formed with at least one axial extending part for partially shielding said end part of said first connection member and shielding a slit formed therebetween.

10. The hinge module for the foldable type device as claimed in claim 1, wherein an opposite axial side of said end part of said first connection member is axially extended with a first shield cover, said first shield cover is served to cover said first shaft part and formed with a radial opening for allowing said first arc-shaped guiding slot to be exposed.

11. The hinge module for the foldable type device as claimed in claim 2, wherein an extending base and at least one hinge received in said extending base are further disposed between said two casings; one axial side of said extending base is further formed with a position limiting slot, an axial wall surface defined at said end part of a second connection member is correspondingly formed with a protrusion, a shaft disposed in said at least one hinge is pivoted with said end part of said second connection member, so that said shaft is coaxially arranged with said second shaft part of said base, and said protrusion is moveably positioned in said second position limiting slot; said extending base is further formed with at least one axial extending part for partially shielding said end part of each of said connection members and shielding a slit formed therebetween.

12. The hinge module for the foldable type device as claimed in claim 2, wherein an opposite axial side of an end part of a second connection member is axially extended with a shield cover, said shield cover is served to cover said second shaft part and formed with a radial opening for allowing said second arc-shaped guiding slot to be exposed.

13. The hinge module for the foldable type device as claimed in claim 1, wherein said first casing body is further formed with at least one accommodating concave slot, a radial elastic unit is received in said one end part of said first radial linkage member, one end part thereof is exposed out from said end part of said first radial linkage member and is in contact with a wall surface of said at least one accommodating concave slot.

14. The hinge module for the foldable type device as claimed in claim 2, wherein said third casing body is further formed with at least one accommodating concave slot, a radial elastic unit is received in an end part of a second radial linkage member, one end part thereof is exposed out from said end part of said second radial linkage member and is in contact with a wall surface of said at least one accommodating concave slot.

15. The hinge module for the foldable type device as claimed in claim 2, wherein an adhering layer is provided between said flexible monitor and same sides of said first casing body and said third casing body, and same sides of said base and an extending base, said adhering layer has a first adhering zone, a second adhering zone and a third adhering zone; said first adhering zone is provided at a partial portion of a cover plate of said second casing body, said second adhering zone is provided at a partial portion of a cover plate of said fourth casing body, and said third adhering zone is served to an assistance for being selectively disposed between a central portion of said base and said extending base.

* * * * *